United States Patent
Kim

(10) Patent No.: US 9,276,426 B2
(45) Date of Patent: Mar. 1, 2016

(54) APPARATUS AND METHOD FOR CHARGING BATTERY OF ELECTRIC DEVICE HAVING MOTOR

(75) Inventor: Bong-Young Kim, Yongin-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 583 days.

(21) Appl. No.: 13/600,594

(22) Filed: Aug. 31, 2012

(65) Prior Publication Data

US 2013/0057075 A1 Mar. 7, 2013

(30) Foreign Application Priority Data

Sep. 2, 2011 (KR) .................. 10-2011-0089212

(51) Int. Cl.
| | |
|---|---|
| *H02J 7/00* | (2006.01) |
| *H02J 7/14* | (2006.01) |
| *H02J 3/38* | (2006.01) |
| *G01R 9/00* | (2006.01) |
| *H02P 9/00* | (2006.01) |
| *H02J 7/32* | (2006.01) |

(52) U.S. Cl.
CPC .............. *H02J 7/0055* (2013.01); *G01R 9/00* (2013.01); *H02J 7/0068* (2013.01); *H02J 7/14* (2013.01); *H02J 7/32* (2013.01); *H02P 9/00* (2013.01); *Y10T 307/658* (2015.04)

(58) Field of Classification Search
CPC ............. H02J 7/00; H02J 7/14; H02J 1/18; H02J 3/38; H02J 7/0055; H02J 7/0068; H02J 7/32; G01R 9/00; H02P 9/00; Y10T 307/658

USPC .............. 320/104, 138; 307/53, 149
See application file for complete search history.

(56) References Cited

U.S. PATENT DOCUMENTS

| | | | | |
|---|---|---|---|---|
| 5,550,445 A | * | 8/1996 | Nii | 318/153 |
| 5,656,916 A | * | 8/1997 | Hotta | 320/160 |
| 5,686,812 A | * | 11/1997 | Hotta | 320/134 |
| 5,771,478 A | * | 6/1998 | Tsukamoto et al. | 701/68 |
| 5,819,864 A | * | 10/1998 | Koike et al. | 180/65.1 |
| 5,964,309 A | * | 10/1999 | Kimura et al. | 180/65.8 |
| 6,037,749 A | * | 3/2000 | Parsonage | 320/132 |

(Continued)

FOREIGN PATENT DOCUMENTS

| | | |
|---|---|---|
| JP | 2000324604 | 11/2000 |
| JP | 2006015887 | 1/2006 |

(Continued)

OTHER PUBLICATIONS

Korean Office Action issued on Aug. 7, 2012 of the Korean Patent Application No. 10-2011-0089212. With its English translation, as U.S. Pat. No. 6,326,765.

*Primary Examiner* — Phallaka Kik
(74) *Attorney, Agent, or Firm* — Robert E. Bushnell, Esq.

(57) ABSTRACT

An apparatus for charging a battery of an electric device that has a motor by not charging the battery before the electric device is used and a method of charging a battery of an electric device that has a motor by using the apparatus. The apparatus includes a load, a motor for driving the load, a battery that provides a power supply to the motor, a generator that converts a kinetic energy that is generated by the motor to an electric energy, and a control unit that senses an amount of the load of the load and, if the amount of the load is less than a reference value, charges the battery by a first charging mode by using the electric energy output from the generator.

16 Claims, 4 Drawing Sheets

(56) References Cited

U.S. PATENT DOCUMENTS

| | | | |
|---|---|---|---|
| 6,121,757 A * | 9/2000 | Takahashi et al. | 322/28 |
| 6,326,765 B1 | 12/2001 | Hughes et al. | |
| 6,661,231 B1 * | 12/2003 | Arai et al. | 324/426 |
| 6,850,038 B2 * | 2/2005 | Arai et al. | 320/132 |
| 7,497,285 B1 | 3/2009 | Radev | |
| 9,026,347 B2 * | 5/2015 | Gadh et al. | 701/123 |
| 2001/0035741 A1 * | 11/2001 | Murakami et al. | 320/150 |
| 2002/0079741 A1 * | 6/2002 | Anderson | 307/64 |
| 2002/0149347 A1 * | 10/2002 | Asada | 322/28 |
| 2003/0006733 A1 * | 1/2003 | Abe | 320/114 |
| 2003/0030415 A1 * | 2/2003 | Tamai et al. | 320/162 |
| 2004/0008031 A1 * | 1/2004 | Arai et al. | 324/429 |
| 2004/0041568 A1 * | 3/2004 | Yang | 324/426 |
| 2004/0263131 A1 * | 12/2004 | Suelzle et al. | 322/28 |
| 2005/0037256 A1 * | 2/2005 | Mukainakano | 429/61 |
| 2005/0151513 A1 * | 7/2005 | Cook et al. | 320/137 |
| 2006/0006845 A1 * | 1/2006 | Aoyama | 322/22 |
| 2006/0091848 A1 * | 5/2006 | Braun et al. | 320/104 |
| 2006/0097577 A1 * | 5/2006 | Kato et al. | 307/10.1 |
| 2006/0101823 A1 * | 5/2006 | Takemoto et al. | 60/716 |
| 2006/0158151 A1 * | 7/2006 | Kimura | 320/106 |
| 2007/0216378 A1 * | 9/2007 | Ozawa et al. | 323/252 |
| 2007/0231626 A1 * | 10/2007 | Kurosawa | 429/13 |
| 2007/0279005 A1 * | 12/2007 | Arai | 320/132 |
| 2008/0238360 A1 * | 10/2008 | Stone et al. | 320/107 |
| 2008/0297109 A1 | 12/2008 | Sandberg et al. | |
| 2008/0319594 A1 | 12/2008 | Shibata et al. | |
| 2009/0167238 A1 * | 7/2009 | McBee | 320/101 |
| 2009/0242288 A1 | 10/2009 | Oyobe et al. | |
| 2011/0101915 A1 * | 5/2011 | Mitsutani | 320/109 |
| 2011/0208383 A1 | 8/2011 | Yamamoto et al. | |
| 2011/0240320 A1 * | 10/2011 | Umemura et al. | 173/46 |
| 2011/0313613 A1 * | 12/2011 | Kawahara et al. | 701/29 |
| 2012/0032517 A1 * | 2/2012 | Ido et al. | 307/77 |
| 2012/0105015 A1 * | 5/2012 | Hermann et al. | 320/164 |
| 2012/0175953 A1 * | 7/2012 | Ohkawa et al. | 307/18 |
| 2013/0043829 A1 * | 2/2013 | Gurlahosur | 320/107 |
| 2014/0195078 A1 * | 7/2014 | Severinsky et al. | 701/22 |
| 2015/0175052 A1 * | 6/2015 | Gergets et al. | B60Q 1/2611 362/542 |

FOREIGN PATENT DOCUMENTS

| | | | | |
|---|---|---|---|---|
| JP | 2006-223616 A | | 8/2006 | |
| KR | 2009-0127024 A | | 12/2009 | |
| KR | 2010-0023908 A | | 3/2010 | |
| WO | WO 2011037257 A1 * | | 3/2011 | 307/18 |

\* cited by examiner

APPARATUS AND METHOD FOR CHARGING BATTERY OF ELECTRIC DEVICE HAVING MOTOR

CLAIM OF PRIORITY

This application makes reference to, incorporates the same herein, and claims all benefits accruing under 35 U.S.C. §119 from an application earlier filed in the Korean Intellectual Property Office on the 2 Sep. 2011 and there duly assigned Serial No. 10-2011-0089212.

BACKGROUND OF THE INVENTION

1. Field of the Invention the present invention relates to an apparatus for charging a battery of an electric device that has a motor by not charging the battery before the electric device is used, and to a method for charging a battery of an electric device that has a motor by using the apparatus.

2. Description of the Related Art

Electric devices with motors run on either a 220V AC supply or on batteries that produce electrical power to the motors. While AC supplies are being used to power these motors, however, batteries are deemed to be continuously discharged due to their power consumption. Accordingly, batteries need to be charged before use.

SUMMARY OF THE INVENTION

One or more embodiments of the present invention include an improved apparatus for charging a battery of an electric device.

One or more embodiments of the present invention include an apparatus for charging a battery of an electric device that has a motor by not charging the battery before the electric device is used.

One or more embodiments of the present invention include a method for charging a battery of an electric device that has a motor by using the apparatus.

Additional aspects will be set forth in part in the description which follows and, in part, will be apparent from the description, or may be learned by the practice of the presented embodiments.

According to one or more embodiments of the present invention, an apparatus for charging a battery includes a load, a motor for driving the load, a battery that supplies electrical power to the motor, a generator that converts kinetic energy that is generated by the motor electric energy, and a control unit that senses a amount of the load of the load and, if the amount of the load is less than a reference value, charges the battery by a first charging mode.

The first charging mode may be used to charge the battery by using the electric energy that is output from the generator.

The apparatus may further include an external power supply unit that supplies electrical power to the apparatus. The control unit may control the battery to be charged by using the electrical power supplied by the external power supply unit.

The apparatus may further include a charger that is connected to the external power supply unit to charge the battery. The control unit may control the battery to be charged by using the electrical power supply provided by the charger.

The control unit may control the battery to be charged by a second charging mode by using a power dump.

The power dump may be generated when the motor is turned to an off state from an on-state or turned to an on state from an off state.

The apparatus may further include a regulator that maintains constant the voltage used to charge the battery.

The apparatus may further include a backflow prevention unit that prevents backflow of electrical current from the battery.

The control unit may control the battery to be charged by a third charging mode which may be manually selected by the user's input.

The apparatus may further include a manually operable button that enables a user to initiate the third charging mode.

When the user button is pushed, the battery may be charged by using the electric energy output from the generator.

When the user button is pushed, the battery may be charged by using the power supply provided by the external power supply providing unit.

When the user button is pushed, the battery may be charged by using the charging power supply provided by the charger.

According to one or more embodiments of the present invention, a method of charging a battery is provided. The method of charging the battery that is used to operate an electric device which includes a motor for driving a load and a battery for supplying electrical power to the motor. The method of charging the battery includes sensing the amount of the load of the load; and charging the battery by a first charging mode when the sensed amount of the load is less than a reference value.

The first charging mode may be used to charge the battery by using electric energy that is converted from the kinetic energy which is generated by the motor.

The charging process may include charging the battery by a second charging mode by using the dump of power.

The dump of power may be generated when the motor is turned to an off state from an on-state or turned to an on state from an off-state.

The charging process may include charging the battery by a third charging mode in response to user's input.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1A:
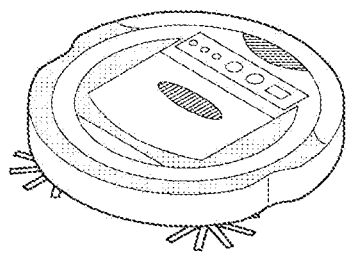
FIGS. 1A through 1D illustrates electric devices constructed with motors and batteries, as embodiments according to the principles of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc. may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc. are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Exemplary embodiments of the invention will be described below in more detail with reference to the accompanying drawings. Those components that are the same or are in correspondence are rendered the same reference numeral regardless of the figure number, and redundant explanations are omitted.

FIGS. 1A through 1D illustrates electric devices with motors and batteries, constructed as embodiments according to the principles of the present invention.

Referring to FIG. 1, a robot vacuum cleaner is illustrated in FIG. 1A. The robot vacuum cleaner is a cleaning device that sucks up dust or foreign materials on the floor, automatically driving on desired regions to be cleaned without an operation of a user. Such a robot vacuum cleaner includes a battery (203 of FIG. 2) and a motor (205 of FIG. 2) to drive wirelessly and includes a fan (not shown) as a load (207 of FIG. 2). In this regard, a motor (205 of FIG. 2) drives the load 207 to suck up dust or foreign materials.

Figure 1B:
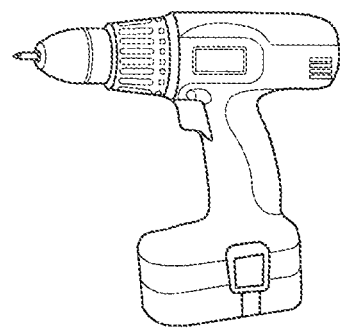

FIG. 1B illustrates an electric tool. The electric tool includes an electric motor and processes metal or wood by using a rotary power thereof. Such an electric tool also includes the battery 203 and the motor 205 to drive wirelessly and includes as the load 207 an electric saw (not shown) or a screwdriver (not shown) that screws a screw or a nut. In this regard, the motor 205 drives the load 207 to process metal or wood.

Figure 1C:
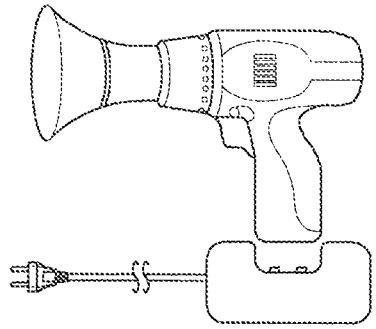

FIG. 1C illustrates a wireless hair dryer. The wireless hair dryer includes the battery 203 and the motor 205 and includes as the load 207 a fan (not shown) that generates a hot wind. In this regard, the motor 205 drives the load 207 to generate a hot wind.

Figure 1D:
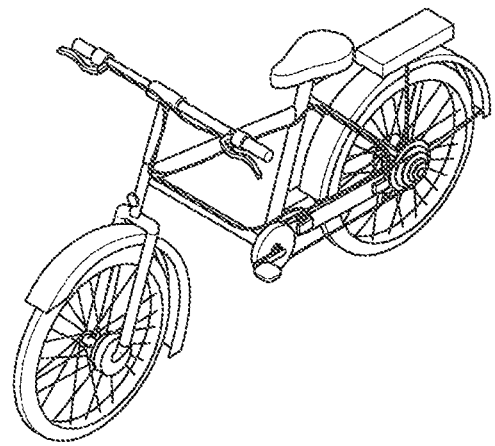

FIG. 1D illustrates an electric bicycle. The electric bicycle includes the battery 203 and the motor 205 and includes pedals as the load 207. In this regard, the motor 205 drives the load 207 to allow the electric bicycle to automatically move.

Although only the robot vacuum cleaner, the electric tool, the wireless hair dryer, and the electric bicycle are illustrated in FIG. 1, any electric devices that have the battery 203 and the motor 205 may be used.

Figure 2:
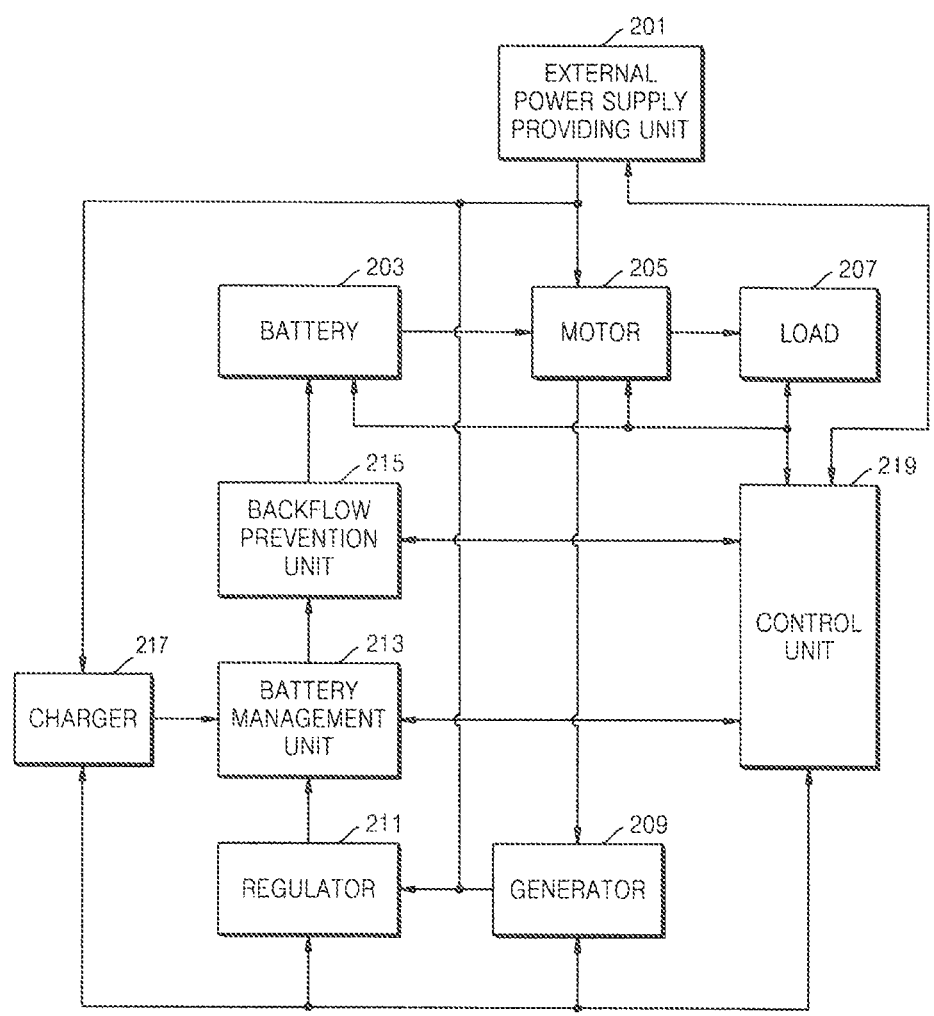
FIG. 2 is a block diagram illustrating a structure of an apparatus for charging a battery of an electric device that has a motor, constructed as an embodiment of the principles of the present invention.

FIG. 2 is a block diagram illustrating a structure of an apparatus for charging a battery of an electric device that has a motor, constructed as an embodiment according to the principles of the present invention.

Referring to FIG. 2, the apparatus includes an external power supply providing unit 201, a battery 203, a motor 205, a load 207, a generator 209, a regulator 211, a battery management unit 213, a backflow prevention unit 215, a charger 217, and a control unit 219.

The external power supply providing unit 201 may be connected to an external power supply via a built-in power supply code. For example, the external power supply providing unit 201 may be supplied with 220V AC power supply for operating an electric device from the external power supply and may regulate the power supply according to the application of the motor 205, thereby providing the regulated power supply to the motor 205.

The battery 203 drives an electric device by supplying charged power thereto. As shown in FIG. 2, the battery 203 supplies the charged power to the motor 205. A battery is generally charged via a charger, but, in this embodiment, the battery 203 may be charged using various methods. Various charging methods of the battery 203 will be described later.

The motor 205 is operated by power supplied from the external power supply providing unit 201 or the battery 203 to drive the load 207. A DC motor may be mainly used as the motor 205, but a direct current/alternating current motor may also be used.

The load 207 is operated by the motor 205. As illustrated in FIG. 1, the load 207 may be a fan that sucks up dust in the robot vacuum cleaner, an electric saw (not shown) for processing metal or wood in the electric tool, a screwdriver that screws a screw or a nut, a fan that generates a hot wind in the electric hair dryer, or the pedals for driving an electric bicycle.

The generator 209 converts a kinetic energy generated by rotation of the motor 205 to an electric energy. The electric energy generated by the generator 209 may be used to charge the battery 203.

The regulator 211 converts the electric energy generated by the generator 209 to power supply that is appropriate for charging the battery 203. The regulator 211 maintains a charging voltage of the battery to be constant.

The battery management unit 213 is connected to the control unit 219 and supervises and manages charge/discharge states of the battery 203.

The backflow prevention unit 215 prevents a backflow of current from the battery 203 during charging and discharging of the battery 203.

The charger 217 charges the battery 203 by using power supply supplied by the external power supply providing unit 201. In this regard, the charging process is performed such that an electric device itself or the battery 203 is inserted into the charger 217.

The control unit 219 controls all the operations of an electric device. In particular, the control unit 219 controls the battery 203 to be charged when the electric device is used.

The control unit 219 continuously senses a state, i.e., a amount of the load, of the load 207 to charge the battery 203 and provides various charging modes that allow the battery 203 to be charged, for example, first, second and third charging modes when the sensed amount of the load is a reference value or lower. In this regard, the reference value indicates an operation value of the load 207 measured by the control unit 219 when the load 207 is originally operated. For example, the case when the reference value may be a amount of the load may be a case when a fan of an electric vacuum cleaner is operated to suck up dust, a case when an electric saw or a screwdriver that screws a screw or a nut of an electric tool is operated to process metal or wood, a case when a fan of a hair dryer is operated to generate a hot wind, or a case when pedals of an electric bicycle are operated to move the bicycle. When the sensed amount of the load is the reference value or greater, the battery 203 is not charged. When the sensed amount of the load is less than the reference value, however, the battery 203 is charged. In this regard, the case when the amount of the load is less than the reference value may be a case when the fan of the electric vacuum cleaner is operated in a dust-free space or the electric vacuum cleaner is moved in operation, a case where the processing of metal or wood performed by the electric tool is temporarily stopped with power supply applied to the electric tool or the electric tool is moved in operation, a case when a temperature of the fan of the electric hair dryer is increased to generate ventilation, or a case when the electric bicycle is moved without operation of pedals. In this case, since the amount of the load is less than the reference value, the battery is charged.

In the first charging mode of the control unit 219, the battery 203 is charged using a power supply that is output from the generator 209. In the first charging mode, the kinetic energy of the motor 205 is converted into the electric energy by the generator 209, and the electric energy goes through the regulator 211, the battery management unit 213, and the backflow prevention unit 215, thereby charging the battery 203.

Figure 3A:
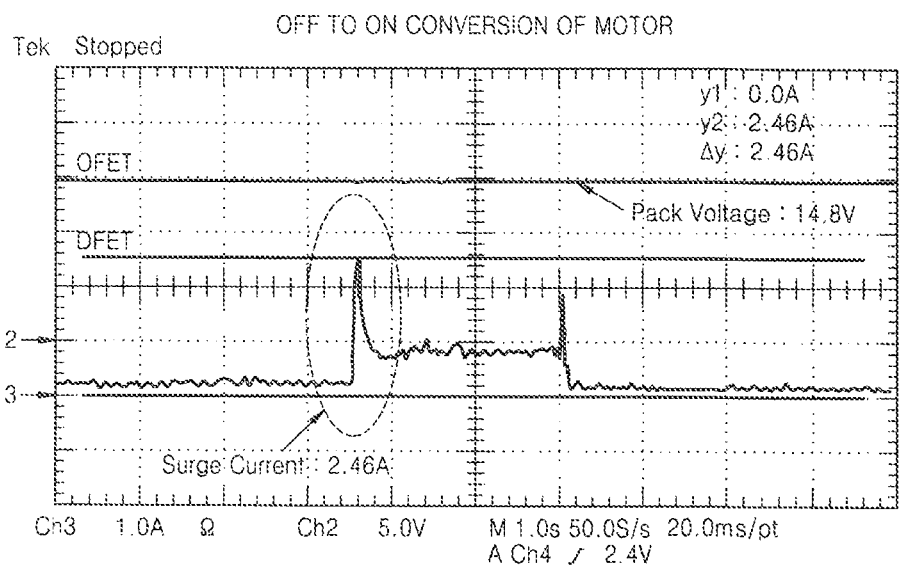
FIGS. 3A and 3B are diagrams illustrating dump power for charging the battery of the electric device of FIG. 2, as an embodiment according to the principles of the present invention.
Figure 3B:
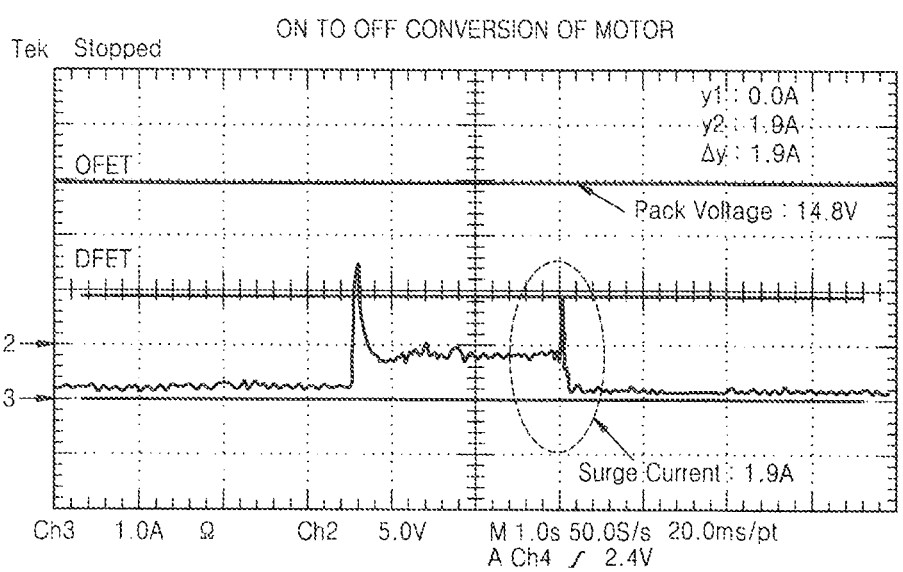

In the second charging mode of the control unit 219, the battery 203 is charged using dump power. FIG. 3 illustrates dump power, i.e., surging voltages generated when the motor 205 of the electric vacuum cleaner is turned off from an on-state or turned on from an off-state. When a pack voltage of the battery 203 is 14.8 V, as illustrated in FIG. 3A, a surging current of 2.46 A is generated when the motor 205 is turned on from an off state, and, as illustrated in FIG. 3B, a surging current of 1.9 A is generated when the motor 205 is turned off from an on-state. The control unit 219 controls the battery 203 to be charged using the dump power generated whenever the motor 205 is turned on or off.

In the third charging mode of the control unit 219, the battery 203 is charged by user's input. For this operation, a key (not shown) may be separately positioned outside the electric device. For example, if a user pushes the key continuously or once while moving the electric device, the control unit 219 receives a signal therefrom to allow the battery 205 to be charged. In this regard, the battery 203 may be directly charged by the external power supply providing unit 201 or may be charged using the electric energy that is generated by the generator 209 from the kinetic energy of the motor 205. In another embodiment according to the principles of the present invention, when the user button is pushed, the battery 203 is charged using the charging power supply provided by the charger 217.

The control unit 219 gives priority to one of the first, second and third charging modes and thus the one of the first, second and third charging modes will be operated first. In this regard, the third charging mode may be selected to be performed in top priority at any time in response to a selection of the third charging mode by user's input. For example, when a load amount is less than a reference value in a state where the priority is set in the order of the first charging mode, the second charging mode, and the third charging mode, the control unit 219 may charge the battery 203 using the first charging mode. In this regard, the priority may be set by a user purchasing an electric device or by a manufacturer when manufacturing an electric device. In one embodiment, when the electric device includes a button (not shown) for selecting the first, second and third charging modes, the control unit 219 may charge the battery 203 using the corresponding charging mode by receiving a charging mode selection signal according to the user's button input.

As described above, the control unit 219 may control the battery 203 to be directly charged by the external power supply providing unit 201 not by using the first, second and third charging modes.

Figure 4:
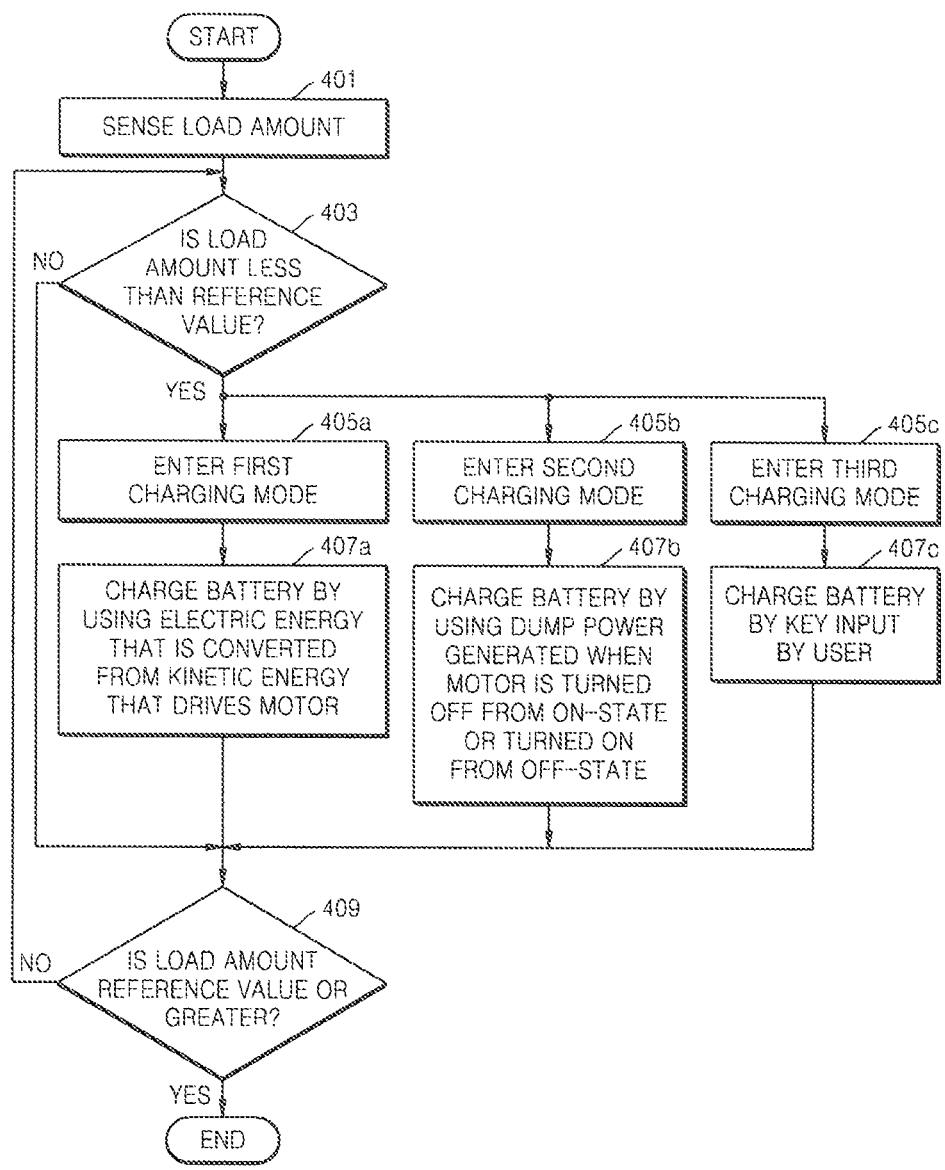
FIG. 4 is a flowchart illustrating an operation of a method of charging a battery of an electric device that has a motor, as an embodiment according to the principles of the present invention.

FIG. 4 is a flowchart illustrating an operation of a method of charging a battery of an electric device that has a motor, as an embodiment according to the principles of the present invention.

The control unit 219 senses a amount of the load of the load 207 to charge the battery 203 (operation 401).

Subsequently, it is determined whether the sensed amount of the load is less than a reference value (operation 403). In this regard, the reference value indicates an operation value of the load 207 measured by the control unit 219 when the load 207 is originally operated. For example, the reference value may be a amount of the load when a fan of an electric vacuum cleaner is operated to suck up dust, when an electric saw or a screwdriver that screws a screw or a nut of an electric tool is operated to process metal or wood, when a fan of a hair dryer operated to generate a hot wind, or when pedals of an electric bicycle are operated to move the bicycle.

As a result of the sensing operation, if the amount of the load is less than the reference value, the control unit 219 enters one of the first, second and third charging modes (operation 405) charges battery 203 by using the particular mode that has been entered (operation 407). In this regard, the case when the amount of the load is less than the reference value may be a case when the fan of the electric vacuum cleaner is operated in a dust-free space or the electric vacuum cleaner is moved in operation, a case where the processing of metal or wood performed by the electric tool is temporarily stopped with power supply applied to the electric tool or the electric tool is moved in operation, a case when a temperature of the fan of the electric hair dryer is increased to generate ventilation, or a case when the electric bicycle is moved without operation of pedals. The control unit 219 gives priority to one of the first, second and third charging modes and thus the one of the first, second and third charging modes is operated first. In this regard, the third charging mode may be operated in top priority at any times by user's input. In addition, the battery 203 may be charged using all of the first, second and third charging modes or any two of the charging modes.

When the amount of the load is less than the reference value, the control unit 219 enters the first charging mode and controls the battery 203 to be charged using power supply that is output from the generator 209. In the first charging mode, a kinetic energy of the motor 205 is converted into an electric energy by the generator 209, and the electric energy goes through the regulator 211, the battery management unit 213, and the backflow prevention unit 215, thereby charging the battery 203.

When the amount of the load is less than the reference value, the control unit 219 enters the second charging mode and controls the battery 203 to be charged with dump power. In this regard, the dump power may be, as illustrated in FIG. 3, dump power, i.e., surging voltages generated when the motor 205 is turned off from an on-state or turned on from an off-state. Thus, the control unit 219 may control the battery 203 to be charged whenever the motor 205 is turned on or off.

When the amount of the load is less than the reference value, the control unit 219 may enter the third charging mode and controls the battery 203 to be charged by user's input. For this operation, a key (not shown) may be separately positioned outside the electric device. For example, if a user pushes the key continuously or once while moving the electric device, the control unit 219 receives a signal therefrom to allow the battery 205 to be charged. In this regard, the battery 203 may be directly charged by the external power supply providing unit 201 or may be charged using the electric energy that is generated by the generator 209 from the kinetic energy of the motor 205.

As described above, the control unit 219 may control the battery 203 to be directly charged by the external power supply providing unit 201 not by using the first, second and third charging modes.

The control unit 219 continuously senses the amount of the load and terminates the operation if the amount of the load is the reference value or greater (operation 409) or goes to the operation 403 if not.

By using the apparatus and method according to the principles of the present invention, the battery of the electric device is charged while the electric device is being used and thus it is not necessary to charge the battery before the electric device is used, which results in convenience of use.

The particular implementations shown and described herein are illustrative examples of the invention and are not intended to otherwise limit the scope of the invention in any way. For the sake of brevity, conventional electronics, control systems, software, and other functional aspects of the systems may not be described in detail. Furthermore, the connecting lines or connectors shown in the various figures presented are intended to represent exemplary functional relationships and/or physical or logical couplings between the various elements. It should be noted that many alternative or additional functional relationships, physical connections, or logical connections may be present in a practical device. Moreover, no item or component is essential to the practice of the invention unless the element is specifically described as "essential" or "critical."

The use of the terms "a" and "an" and "the" and similar referents in the context of describing the invention (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples or exemplary language (e.g., "such as") provided herein, is intended merely to better illuminate the invention and does not pose a limitation on the scope of the invention unless otherwise claimed. Moreover, it is well understood by one of ordinary skill in the art that numerous modifications, adaptations, and changes may be made under design conditions and factors without departing from the spirit and scope of the invention as defined by the following claims and within the range of equivalents thereof.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An apparatus for charging a battery, the apparatus comprising:
    a load;
    a motor for driving the load;
    a battery that provides a power supply to the motor;
    a generator, separate from the motor, that converts a kinetic energy that is generated by the motor to an electric energy; and
    a control unit that senses an amount of the load and, if the amount of the load is less than a reference value, charges the battery by a first charging mode, wherein the first charging mode is used to charge the battery by using the electric energy that is output from the generator.

2. The apparatus of claim 1, further comprising an external power supply providing unit that provides power supply to the apparatus, wherein the control unit controls the battery to be charged using the power supply provided by the external power supply providing unit.

3. The apparatus of claim 2, further comprising a charger that is connected to the external power supply providing unit to charge the battery, wherein the control unit controls the battery to be charged using a charging power supply provided by the charger.

4. The apparatus of claim 1, wherein the control unit controls the battery to be charged by a second charging mode by using dump power.

5. The apparatus of claim 4, wherein the dump power is generated when the motor is turned off from an on-state or turned on from an off-state.

6. The apparatus of claim 1, further comprising a regulator that maintains a charging voltage of the battery constant.

7. The apparatus of claim 1, further comprising a backflow prevention unit that prevents a backflow from the battery.

8. The apparatus of claim 1, wherein the control unit controls the battery to be charged by a third charging mode by user's input.

9. The apparatus of claim 8, further comprising a user button for the third charging mode.

10. The apparatus of claim 9, wherein, when the user button is pushed, the battery is charged using the electric energy output from the generator.

11. The apparatus of claim 9, wherein, when the user button is pushed, the battery is charged using the power supply provided by the external power supply providing unit.

12. The apparatus of claim 9, wherein, when the user button is pushed, the battery is charged using the charging power supply provided by a charger.

13. A method of charging a battery, the method is used to operate an electric device that comprises a motor for driving a load and a battery for providing a power supply to the motor, the method comprising:
    sensing an amount of the load; and
    charging the battery by a first charging mode when the sensed amount of the load is less than a reference value, wherein the first charging mode converts kinetic energy, generated by the motor, to an electric energy, by a separate generator, to charge the battery.

14. The method of claim 13, further comprising charging the battery by a second charging mode by using dump power.

15. The method of claim 14, wherein the dump power is generated when the motor is turned off from an on-state or turned on from an off-state.

16. The method of claim 13, further comprising charging the battery by a third charging mode by user's input.

* * * * *